(12) United States Patent
Tio Castro et al.

(10) Patent No.: US 8,379,438 B2
(45) Date of Patent: Feb. 19, 2013

(54) ELECTRONIC DEVICE, AND METHOD OF OPERATING AN ELECTRONIC DEVICE

(75) Inventors: David Tio Castro, Heverlee (BE); Karen Attenborough, Hechtel-Eksel (BE)

(73) Assignee: NXP B.V., Eindhoven (NL)

( * ) Notice: Subject to any disclaimer, the term of this patent is extended or adjusted under 35 U.S.C. 154(b) by 380 days.

(21) Appl. No.: 12/593,937

(22) PCT Filed: Mar. 19, 2008

(86) PCT No.: PCT/IB2008/051040
§ 371 (c)(1),
(2), (4) Date: Sep. 30, 2009

(87) PCT Pub. No.: WO2008/120126
PCT Pub. Date: Oct. 9, 2008

(65) Prior Publication Data
US 2010/0238720 A1      Sep. 23, 2010

(30) Foreign Application Priority Data
Mar. 30, 2007   (EP) .................................. 07105410

(51) Int. Cl.
| G11C 11/21 | (2006.01) |
| G11C 11/42 | (2006.01) |
| G11C 7/00  | (2006.01) |
| G11C 7/22  | (2006.01) |
| G11C 13/04 | (2006.01) |
| G11C 13/00 | (2006.01) |
| G11C 11/00 | (2006.01) |

(52) U.S. Cl. .................. 365/163; 365/189.16; 365/113; 365/106; 365/215

(58) Field of Classification Search .................. 365/163, 365/148, 106, 113, 189.16, 215, 64
See application file for complete search history.

(56) References Cited

U.S. PATENT DOCUMENTS
| 6,900,468 B2 * | 5/2005 | Chalken et al. ................. 257/80 |
| 7,642,538 B2 * | 1/2010 | Fujita et al. .................... 257/130 |
| 2004/0036944 A1 | 2/2004 | Tsu |
| 2005/0169093 A1 | 8/2005 | Choi et al. |
| 2006/0102927 A1 | 5/2006 | Fujita et al. |
| 2006/0109707 A1 | 5/2006 | Happ et al. |
| 2006/0208847 A1 * | 9/2006 | Lankhorst et al. ................. 338/9 |

FOREIGN PATENT DOCUMENTS
| CN | 1729575 A    | 2/2006 |
| EP | 1 233 418 A1 | 8/2002 |
| EP | 1 734 593 A  | 12/2006 |
| WO | 2004057676 A2 | 7/2004 |
| WO | 2005031307 A | 4/2005 |

\* cited by examiner

*Primary Examiner* — J. H. Hur

(57) ABSTRACT

An electronic device comprising a heat transfer structure and a phase change structure which is convertible between two phase states by heating, wherein the phase change structure is electrically conductive in at least one of the two phase states, wherein the heat transfer structure is arranged to be heated by radiation impinging on the heat transfer structure, wherein the phase change structure is thermally coupled to the heat transfer structure so that the phase change structure is convertible between the two phase states when the radiation impinges on the heat transfer structure.

20 Claims, 8 Drawing Sheets

ELECTRONIC DEVICE, AND METHOD OF OPERATING AN ELECTRONIC DEVICE

FIELD OF THE INVENTION

The invention relates to an electronic device.

Moreover, the invention relates to a method of operating an electronic device.

BACKGROUND OF THE INVENTION

In the field of non-volatile memories, flash memory scaling beyond a 45 nm node has become a real issue. Technologies to face this challenge are ferroelectric, magnetic and phase change memories, the latter one being promising for the replacement of flash and showing characteristic that may allow replacement of other types of memories such as DRAM. Phase change memories are a possible solution for the unified memory being an important step in the electronics art. OTP ("on time programmable") and MTP ("multiple times programmable") memories open a field that may present a great opportunity for phase change memories as well.

Phase change memories are based on a reversible memory switching using, for instance, chalcogenide materials. Thus, phase change materials may be used to store information. The operational principle of these materials is a change of phase. In a crystalline phase, the material structure is (and thus properties are) different from the properties in the amorphous phase.

In silicon-based memories, the programming of a phase change material is based on the difference between the resistivity of the material in its amorphous and crystalline phase. An electrical current may be used to sense such a difference. By tuning this electrical current, writing may be also possible.

To switch between these phases, an increase in temperature is required. Very high temperatures with rapid cooling down will result in an amorphous phase. A smaller increase in temperature or slower cooling down may lead to a crystalline phase.

In a silicon-based memory, the principle is that the increase in temperature may be obtained by applying an electrical pulse to the memory cell. A high current density may lead to a local temperature increase. Depending on the shape of the pulse, the temperature profile may be different, resulting in one phase or another.

FIG. 2 shows a diagram 200 having an abscissa 201 along which the time is plotted. Along an ordinate 202, a temperature is plotted.

FIG. 2 shows temperature profiles obtained by applying electric pulses to conventional chalcogenide based phase transition material memories for switching the memory between the two phases. A first pulse 203 may be applied as a RESET pulse for amorphizing such a chalcogenide material. A second pulse 204 may be denoted as a SET pulse and may be used for crystallizing a chalcogenide-based memory. A time $t_1$ is indicative of a time interval during which the first pulse 203 is changed between a temperature Tm and a temperature Tx. A second time interval $t_2$ denotes a time interval which the second pulse 204 needs to be changed from Tx to an essentially constant asymptotic value.

The SET and RESET temperature profiles shown in FIG. 2 can be applied to a conventional phase change material memory 300 as shown in FIG. 3.

In the phase change material memory 300 shown in FIG. 3, a resistor 301 having a modifiable resistivity (realized as a phase change material) is arranged between a supply voltage reference $V_{dd}$ and a drain voltage $V_D$ of a switch transistor 302. The source of the switch transistor 302 is connected to the reference potential $V_s$=0. Furthermore, a gate voltage $V_G$ may be applied to the gate of the switch transistor 302 to selectively enable or disable access to the switch transistor 302.

The increment in temperature in a phase change cell 300 is proportional to the power applied to the memory cell 300. The transistor 302 driving the memory element 301 is designed to stand a power level proportional to the one applied to the phase change element 301 (as the transistor 302 is in series with the phase change element 301). This means that when the phase change element 301 has a higher power necessity, the transistor 302 should stand more power.

As depicted in FIG. 4, the amorphisation pulse 203 is an electric pulse that needs to dissipate more power than the crystallisation pulse 204.

In FIG. 4, a diagram 400 is shown having an abscissa 401 along which a pulse width in nanoseconds is plotted. Along an ordinate 402 of the diagram 400, a power in Watt is plotted. FIG. 4 shows a minimum amorphisation power 203 versus crystallisation power 204 in a line phase change cell. It can be seen that the crystallisation power 204 is lower than the amorphisation power 204.

Hence, the transistor 302 will need more drive power when programming the amorphous state. On the other hand, the transistor 302 size depends on the power it needs to withstand. In conclusion, the transistor 302 dimensions are given by the power requirements of the amorphisation pulse 203.

FIG. 5 shows a diagram 500 having an abscissa 501 along which a pulse width in nanoseconds is plotted and having an ordinate 502 along which a current in arbitrary units is plotted. A first curve 503 shows a RESET current and a second curve 504 shows a SET current, for an exemplary cell.

Therefore, FIG. 5 shows programming currents for SET (crystallization) 504 and RESET (amorphisation) 503 for different pulse widths in a phase change line of an exemplary cell. The SET state can be achieved with currents lower than a threshold value. In the case of RESET pulses, currents over a threshold value are required.

FIG. 6 shows a diagram 600 having an abscissa 601 along which a channel width is plotted in nm and having an ordinate 602 along which a drain current is plotted in mA. Drain current saturation is indicated by reference numeral 603.

Thus, FIG. 6 shows NMOS Ids currents used in the design of a phase change memory array. In other words, FIG. 6 shows data for a 200 nm long NMOS transistor used in a phase change memory. According to FIG. 5, a 100 ns pulse of less than a threshold value can SET a cell. To RESET a cell with 100 ns, a certain current is required. To get a SET current, a 200 nm length by 400 nm width transistor can be used. The minimum transistor that can provide the RESET current is a 200 nm length by 800 nm width. This means that RESET currents need a transistor twice as big as a transistor used to drive the SET current.

Consequently, the space used in a phase change memory is mainly determined by RESET currents and the required transistors to handle them. Conventionally operated phase change memory cells are therefore large due to the necessity of large transistors and are prone to failure since large programming currents are required.

EP 1,233,418 A1 discloses an ultra-high-density data-storage media employing indium chalcogenide, gallium chalcogenide, and indium-gallium chalcogenide films to form bit-storage regions that act as photoconductive, photovoltaic, or photoluminescent semiconductor devices that produce electrical signals when exposed to electromagnetic radiation, or to form bit-storage regions that act as cathodoconductive, cathodovoltaic, or cathodoluminescent semiconductor devices that produce electrical signals when exposed to electron beams. Two values of a bit are represented by two solid phases of the data-storage medium, a crystalline phase and an amorphous phase, with transition between the two phases effected by heating the bit storage region.

However, the high power demand of the electric heating procedure according to EP 1,233,418 A1 may be problematic.

OBJECT AND SUMMARY OF THE INVENTION

It is an object of the invention to provide an electronic component having a convertible structure that can be heated without a demand for high electric power.

In order to achieve the object defined above, an electronic device and a method of operating an electronic device according to the independent claims are provided. Thus, a heating procedure may be provided which may allow heating with a lower Joule heating component and/or with a secondary heat source that may reduce or eliminate the Joule heating need.

According to an exemplary embodiment of the invention, an electronic device is provided comprising a heat transfer structure (for instance a heatable structure for transferring heat or thermal energy to a component which is thermally coupled to the heatable structure) and a convertible structure (for instance a phase change structure) which is convertible between two (or more) states (such as phase states) by heating, wherein the convertible structure has different electric properties (such as a value of the electrical conductivity, the permittivity, the magnetic permeability, the capacitance, the inductance, etc.) in different ones of the at least two states, wherein the heat transfer structure is arranged to (selectively) interact with (particularly to be heated by) radiation impinging on the heat transfer structure, wherein the convertible structure is coupled (for instance thermally and/or electrically, so that the convertible structure can get additional heat from the heat transfer structure) to the heat transfer structure in a manner that the convertible structure is convertible between (different ones of) the two (or more) states when the radiation impinges on the heat transfer structure. For instance, a part of or the entire convertible structure may be electrically conductive in at least one of the at least two phase states.

According to another exemplary embodiment of the invention, a method of operating an electronic device is provided, the method comprising impinging radiation on a heat transfer structure of the electronic device (or irradiating a heat transfer structure with radiation) for effecting an interaction between the heat transfer structure and the impinging radiation, and heating a convertible structure (for instance a phase change structure) of the electronic device, which convertible structure is coupled to the heat transfer structure, under the influence of the radiation impinging on the heat transfer structure to thereby convert the convertible structure between two phase states (using an indirect heating mechanism), wherein the convertible structure has different electric properties in different ones of the at least two phase states. For instance, a part of or the entire convertible structure may be electrically conductive in at least one of the at least two phase states.

The term "electronic device" may particularly denote any component, member or apparatus that fulfils any electric, magnetic and/or electronic functionality. This means that electric, magnetic and/or electromagnetic signals may be applied to and/or generated by the electronic device during regular use.

The term "heat transfer structure" (or heatable structure) may particularly denote any physical component which is specifically adapted to interact with radiation and which may particularly act as an indirect heating agent for heating a thermally coupled structure such as a phase change material. Particularly, the heat transfer structure may be an electrode that can be heated by impinging radiation. The heat transfer structure may be denoted as a thermal interface between the actual heating agent (radiation) and a structure to be heated (phase change material). Thus, the heat transfer structure may be specifically designed to properly interact with the radiation (for instance by absorption) and to efficiently transfer the thermal energy to the phase change material.

The term "convertible structure" may particularly denote any physical structure having convertible properties. Examples are a phase change structure or a structure with thermo-dependent properties. Phase change materials can have not only two phases but also more than two phases, for instance crystalline, amorphous, meta-amorphous, meta-crystalline, crystalline with a different lattice orientation, etc.

The term "phase change structure" may particularly denote any physical structure that has the property to change any physical parameter or material property under the influence of incoming radiation. This may particularly mean a switch of a material such as a chalcogenide between an amorphous configuration and a crystalline configuration, which may be accompanied by a significant change in the electrical resistivity. However, any other phase changes such as a change from a solid to a liquid phase, which phase changes are connected with a change of a physical property, may be covered by this term.

The term "thermally coupled" may particularly denote that the heat transfer structure and the phase change material are connected in such a manner that efficient heat conduction, heat radiation or heat convection is possible between these two structures. In other words, heating of the heat transfer structure may result in heating of the phase change structure.

The term "radiation" may particularly denote a beam of photons or particles (such as alpha rays or beta rays). More particularly, the term "electromagnetic radiation" may denote a beam of photons of any appropriate wavelength. This may include the optical spectrum (for instance the range between 400 nm and 800 nm), but may also include electromagnetic radiation of other wavelengths, like UV, infrared, or even X-rays.

The term "memory cell" may particularly denote a physical structure (such as a layer sequence, for instance monolithically integrated in a substrate such as a silicon substrate) that allows storing information in an electronic manner. An amount of information stored in a memory cell may be 1 bit (particularly when the phase change material is switched between two phases) or may be more than 1 bit (particularly when the phase change material is switched between at least three phases). The memory cell may be formed on and/or in a substrate that may denote any suitable material, such as a semiconductor, glass, plastic, etc. According to an exemplary embodiment, the term "substrate" may be used to define generally the elements for layers that underlie and/or overlie a layer or portions of interest. Also, the substrate may be any other base on which a layer is formed, for example a semiconductor wafer such as a silicon wafer or silicon chip.

According to an exemplary embodiment of the invention, an electronic device is provided in which a heat transfer structure may be activated by irradiation with a radiation beam. Such an irradiation of the heat transfer structure will automatically result in the heating of a phase change structure which is thermally coupled to the heat transfer structure, to such an extent that the phase change structure can change its phase in correspondence with a heating pattern which is applied indirectly from the radiation via the heat transfer structure to the phase change structure. Therefore, the phase change structure can be switched between two modes which differ regarding the electric conductivity of the phase change structure, thereby allowing to use the phase change structure as an electronic switch element. This may have applications in the field of memories, actuators, switches, etc. In contrast to conventional approaches in which pure direct heating of a phase change structure is effected by directly irradiating the phase change structure with radiation, embodiments of the invention selectively irradiate a dedicated heat transfer structure (which can therefore be specifically designed for an efficient energy conversion and energy transfer) which in turn provides heating power to the energy-switchable structure.

In a DVD/CD, a reflective layer and special passivation are needed, the capping material must be transparent to the light source therefore it can not be integrated in a chip for the same reason. According to an exemplary embodiment of the invention, since the radiation does not need to be light, there is no need for a special coating or passivation, then, standard CMOS passivation can be used.

Therefore, according to an exemplary embodiment of the invention, a phase-change programming-scheme using incoming radiation may be provided. Phase change materials may have the ability to change to their structure from crystalline to amorphous as a response to a specific temperature profile. This change of structural properties needs a high temperature to take place. According to an exemplary embodiment of the invention, phase change materials may be programmed using (electromagnetic) radiation to heat an electrode. This electrode can use the absorbed electromagnetic radiation to heat up. Placed next to a phase change material element, the temperature profile of the electrode will be coupled to the phase change material. The phase change temperature profile may be controlled with the electrode's temperature profile and therefore with the incoming radiation (see for instance the embodiment of FIG. 12). Building a memory with pairs of electrode phase change materials can bring up new possibilities for these memories. Since programming with large electric signals becomes dispensible, switch transistors of memory cells implementing such a phase change material system may be built significantly smaller.

According to an exemplary embodiment of the invention, a memory cell is provided comprising a memory element consisting of a phase change material. A transistor element may be provided for providing a programming current for setting the phase change material to a crystallization phase. A control element which may also be denoted as a heat transfer structure may be adapted to receive radiation energy and transform it into temperature, wherein the control element may be positioned such that heat transfer between the control element and the phase change material can occur. Embodiments of the invention are related to the phase change programming by incoming radiation, which may implement phase change materials that are used to store information. In a crystalline phase, the material structure is, and thus properties are, different from the properties in an amorphous phase. To switch between both phases, an increase in temperature is required. Very high temperatures with rapid cooling down may result in an amorphous phase, whereas a smaller increase in temperature or a slower cooling down may lead to a crystalline phase. By applying radiation such as electromagnetic radiation to a silicon-based memory cell, it will lead to a local temperature increase in the cell. Depending on the shape and the parameters of the pulse, the temperature profile will be different, resulting in one phase or in another.

According to an exemplary embodiment, small transistors may be able to SET the memory. A RESET state may be achieved by delivering a SET pulse (for instance by applying an electric signal) together with extra power to a phase change line. An electromagnetic radiation beam may provide this extra power needed to achieve the RESET temperature. Thus, the electromagnetic radiation may be used to additionally heat a phase change material to the required temperature.

More generally, embodiments of the invention may use the variation of the properties of a material (for instance the structure of a phase change material) using temperature, wherein this temperature may be provided by an element (for instance an adjacent electrode) that can be heated up using external incoming radiation (for example electromagnetic radiation).

There are several effects that can be implemented to rise the temperature of an electrode by radiation that can be used. An appropriate one is induction heating that is explained in the following.

Induction heating may be a non-contact heating process. It may use high-frequency electricity to heat materials that are electrically conductive. Since a corresponding heating process is a non-contact one, such a heating process does not contaminate the material being heated. It is also very efficient, since the heat is actually generated inside the work piece.

Eddy currents are generated as a result of Faraday's law of electromagnetic induction:

$$emf = -d\Phi/dt$$

In this equation, emf is the electromotive force, generated by the time varying magnetic flux inside the object. The current inside the object may generate the Joule heat, increasing the temperature of the material.

An alternating magnetic field induces a current flow in the conductive work piece. Depending on the nature of the work piece material, a number of effects may happen.

The system can be thought as an electrical transformer, wherein the electromagnetic radiation can be considered to flow between the primary and the secondary. The work piece may be like a single turn secondary that is short-circuited. This may cause tremendous currents to flow through the work piece. These are known as eddy currents. In addition to this, the high-frequency used in induction heating applications may give rise to a phenomenon called skin effect. The skin effect forces the alternating current to flow in a thin layer towards the surface of the work piece. The skin effect increases the effective resistance of the metal to the passage of the large current. Therefore, it greatly increases the heating effect caused by the current induced in the work piece.

For permanent magnetic materials, particularly ferrous materials, like irons and some types of steel, there is an additional heating mechanism that may take place at the same time as the eddy currents and the intense alternating magnetic fields inside the work coil repeatedly magnetize and demagnetize the iron crystals. This rapid flipping of the magnetic domains may cause considerable friction and heating inside the material. Heating due to this mechanism is known as hysteresis loss, and is created for materials that have a large area inside their B-H curve. This can be a large contributing factor to the heat generated during induction heating, but only takes place inside of ferrous materials. For this reason, ferrous materials lend themselves more easily to heating by induction than non-ferrous materials. Steel loses its magnetic properties when heated above approximately 700° C.

This temperature is known as the Curie temperature. This means that above 700° C. there can be no heating of the material due to hysteresis losses. Any further heating of the material will be due to induced eddy currents alone. The fact that copper and aluminium are both non-magnetic and very good electrical conductors can make these materials a challenge to heat efficiently. A proper course of action for these materials is up to the frequency to exaggerate losses due to the skin effect. This property of copper and aluminium results in another advantage which may be obtained according to exemplary embodiments of the invention. The poor heating efficiency, the antenna rules and the design and the lack of skin effect (due to the dimensions of copper or aluminium lines) can assure that the temperature of the copper in a chip stays low while the heaters increase the temperature significantly.

A temperature necessary to program a phase change material to its amorphous phase (melting temperature) may depend on the composition of the phase change material. Typical melting temperatures are around 600° C., but may be less such as 560° C. These values prove the feasibility of embodiments of the invention in terms of temperatures since induction heating can get these temperatures. In addition, the general trend is to lower programming temperatures to reduce power consumption and transistor requirements. Since some materials can be heated to very high temperatures for magnetic induction, amorphisation and crystallisation temperatures can be achieved only using radiation without the need of an additional electrical pulse.

Another issue is the quench rate. To be able to amorphise the material, it needs to be cooled down very fast after heating. $10^{11}$ K/s may be a possible cooling rate.

Different kind of radiations to heat an object can be made with light. NIR (near infrared) light may be used to heat nano-shells, to destroy cancer cells, and may be used as well for triggering a switch of phase change materials.

Memories (RAM, MTP, OTP, etc.) can be built using a much reduced space (smaller transistors) according to exemplary embodiments of the invention. These memories may be electrically programmable to the SET state and electromagnetically erasable (the whole memory in one single operation) to the RESET state. Like this, small transistors are sufficient so that the size of the memory may be reduced.

Exemplary embodiments of the invention may be implemented in the field of phase change materials and memories, where parallel programming will allow mass programming of high quantities of memories at the same time. It will allow delivering embedded OTP to be programmed by a final customer or even user, with an important reduction in size, as big transistors can be avoided. In addition, embodiments of the invention may also be used for mass erasing of phase change memories.

To erase (RESET) the memory, the heat generated by the incoming radiation can be empowered with an electrical SET pulse. Nevertheless, if the heaters and incoming radiation are tuned well enough, the temperature achieved with the incoming radiation may be enough to get rid of additional electrical SET pulses.

Many memories can be erased (amorphised or RESET) at the same time, which may save time and money. For instance, this may be accomplished by a chamber or oven in which all the memories to be programmed are introduced. In such a chamber, an electromagnetic radiation (such as an infrared radiation) may be generated.

Alternatively, it is also possible to erase or program an individual memory cell independently from other memory cells. This may be accomplished by an electromagnetic radiation source capable of producing a beam that is spatially limited in very small dimensions. For this purpose, a Laser beam may be used or a light source having dimensions which are in the same order of magnitude as the structure to be programmed/erased. Thus, individually or collectively programming/erasing may be made possible.

In the case of products (electronic chips, for instance) that contain embedded memories, memories can be tested with several programming cycles and afterwards be delivered to third parties with a typical programming status (typically all the memories in the amorphous/RESET/erased state). A user may be able to program own data just by programming the desired SET/crystalline pattern, and by this, configuring the product to user specified needs.

Another advantage of great interest is the simplicity from the integration point of view. No extra mask may be required for manufacturing a corresponding integrated circuit, as the heater structure has a big degree of flexibility.

Other functions of the invention may be useful as well, as actuators, controllers or transducers depending on/sensitive to external electromagnetic radiation.

An electromagnetic radiation sensor and/or actuator can also be built by using such a method. This may allow involving many further applications, as a gain controller, a radiation detector, etc.

According to an exemplary embodiment of the invention, the variation of the properties of a material (for instance a structure of a phase change material) using temperature may be made possible, when this temperature is provided by an element (for instance an adjacent electrode) that can be heated up by means of an external incoming radiation (for example electromagnetic radiation).

Many embodiments can be applied to the described concept related to the shape and the relative positions of the heater electrode, the embodiments regarding the phase change material structure and composition, the heat electrode structure and composition, the relationship between both of them, the dimensions, nature and shape of the incoming radiation and the final application on the set.

For instance, a heater electrode can be placed in parallel, perpendicularly, forming an angle, on top, below, embedded, in contact with or separate from a temperature dependent element. An incoming radiation causes the electrode to heat up, coupling parts of this heat to the temperature dependent material and causing the properties of this temperature material to change.

The heater element can be a horizontal or vertical structure (related to a substrate on and/or in which the system may be formed), and may comprise one or several levels.

The heater can be made of any material, element, alloy or combination of the previous, rising its temperature as a result of an incident electromagnetic radiation.

The temperature dependent material (phase change material as an example) can be modified momentarily or indefinitely, changes can be reversible or irreversible.

According to an exemplary embodiment of the invention, a radiation sensor (and/or an actuator and/or a gain controller) may be provided. In the case of an electromagnetic radiation sensor, just placing the heater electrode next to a temperature dependent material (for instance an NTC resistor, that is a resistor having a negative temperature coefficient), the variation in the field may induce a change in the currents and the heater electrode. This change of a temperature may induce a change of the value of the thermo-dependent material, using it to control the device in which it is embedded (for instance the polarisation point of a transistor). In such a manner, it may be possible to manufacture an automatic gain controller, an automatic switch, based on the level of incoming radiation.

According to an exemplary embodiment of the invention, the energy is not supplied directly to the phase change material but to a (parallel) heater that can make a better use of it (since it is possible to tune this heatable element specifically for the absorption of the radiation at one or another frequency, etc.). In this context, it is possible to make use of resonance absorption effects. In this context, heat transfer structure and radiation may be adjusted to one another. A radiation pulse for affecting the heatable element can be tuned by the power and/or frequency of the incoming radiation, as well as it can be done with different heaters (absorbing the radiation and producing the heat).

Thus, radiation may be used to increase the temperature of a heater and this temperature may change the temperature of the phase change material.

Radiation, particularly electromagnetic radiation, to be used according to exemplary embodiments of the invention, may be used to heat an electrode and to indirectly cause a change in the resistance of a phase change material. The used radiation can be any kind of electromagnetic radiation. The process according to exemplary embodiments of the invention is completely reversible, so it is possible to operate a memory cell to RESET or to SET, and this can be done many (infinite) times.

Depending on the characteristics of the radiation (wavelength, intensity, etc.) and the electrode (specific absorption for the electromagnetic spectrum, ferromagnetism, etc.) it may be possible to make it sensible to the radiation desired. For instance, it is possible to choose a proper electrode (convenient for integration, ferromagnetic to use the heating effect because of ferromagnetic domains, etc.) and then configure used radiation to be the most appropriate to heat.

Next, further exemplary embodiments of the electronic device will be explained. However, these embodiments also apply to the method of operating the electronic device.

The heat transfer structure may be arranged to be heated by electromagnetic radiation impinging on the heat transfer structure. In other words, when an electromagnetic beam with specific frequency, bandwidth, intensity, polarisation, coherence and/or amplitude properties is directed onto the heat transfer structure such as an electrode, interaction between the electromagnetic radiation and the material of the heat transfer structure occurs, and this results in heat generated in the heat transfer structure and/or in the phase change material which is thermally coupled (for instance connected in such a manner that efficient heat conduction, heat radiation or heat convection is possible between two structures) to the heat transfer structure. Therefore, an efficient heat transfer is made possible with an indirect heating scheme which allows to separately optimize the heat transfer structure for proper interaction with the electromagnetic radiation and the phase change material for proper phase change characteristics.

The phase change structure may be adapted such that a value of the electrical conductivity differs between the two phase-states. In one of the at least two phase states, the phase change structure may be electrically conductive (for instance essentially metallically conductive). In the other phase state, the electrical conductivity may be larger or lower than in the first state, for instance the phase change structure may be superconductive or may be semiconductive or may be isolating or may be conductive as well with a modified value of conductivity. In a normal operation of the electronic device, the function of the electronic device will be influenced, will be defined or will depend on the present value of the electrical conductivity of the phase change structure. This may allow manufacturing memory cells, switches, actuators, sensors, etc. using the different value of the electrical conductivity of the phase change structure in the different phase modes.

The phase change structure may be adapted such that one of the two phase-states relates to a crystalline phase and the other one of the two phase states relates to an amorphous phase of the phase change structure. Such a material property can be found in chalcogenide materials. A chalcogenide glass may be used which is a glass containing a chalcogenide element (sulphur, selenium or tellurium) as a substantial constituent. Examples for phase change materials are GeSbTe, AgInSbTe, InSe, SbSe, SbTe, InSbSe, InSbTe, GeSbSe, GeSbTeSe or AgInSbSeTe.

The electronic device may comprise a radiation source adapted for generating the radiation for impinging on the heat transfer structure. Particularly, the electronic device may comprise an electromagnetic radiation source adapted for generating the electromagnetic radiation for impinging on the heat transfer structure. Such a radiation source may be a separate electromagnetic radiation source such as a laser or a photodiode. However, it may also be possible that a radiation source is an oven within which the heat transfer structure and the phase change materials are placed, wherein the generation of radiation in the oven represents the electromagnetic radiation which can be absorbed by the heat transfer structure and which may be thermally conveyed to the phase change material for phase changing. Such an oven may be a conventional oven, or may be a chamber in which any electromagnetic radiation is generated (such as microwaves, etc.)

The radiation source may be adapted for generating the radiation in accordance with at least one predetermined radiation pulse pattern. For instance, intensity, time duration and shape of a pulse may be adjusted so as to allow designing a first pulse for changing the phase change material from an amorphous state into a crystalline state. A second pulse may be shaped for changing the phase change material from the crystalline shape into the amorphous shape. Thus, by specifically designing the pulse patterns, programming or setting the phase change material may be made possible. A time dependence of a heat impact acting on the phase change structure may reflect a time dependence of the exciting electromagnetic radiation source.

The at least one predetermined radiation pulse pattern may comprise a first radiation pulse pattern adapted for converting the phase change structure from a first one of the two phases into a second one of the two phases, and may comprise a second radiation pulse pattern adapted for converting the phase change structure from the second one of the two phases into the first one of the two phases. The first radiation pulse pattern may extend over a first time interval and may be adapted for heating the phase change structure up to a first temperature value. The second radiation pulse pattern may extend over a second time interval and may be adapted for heating the phase change structure up to a second temperature value. The first time interval may optionally be larger than the second time interval and the first temperature value may be smaller than the second temperature value. Furthermore, the amplitude of the first time interval may be larger than an amplitude of the second time interval. In such a scenario, the first radiation pulse pattern and the second radiation pulse pattern may each comprise a raising edge curved to the right (that is a graph which is concave down) and a falling edge curved to the left (that is a graph which is shaped in a convex way). An example for such a kind of pattern is shown in FIG. 11. This allows to reversibly switch a phase change material from a crystalline state to an amorphous state, or vice versa. The exact shape may be adjusted over a broad range and can vary a lot. It may be advantageous that RESET pulses use higher amplitudes than the SET pulses. Also RESET may have an abrupt falling edge. The SET usually has a mild falling edge but it depends also on the material.

However, also the falling edges of the pulses can be different. The shapes can be modified over a broad range. It can be even a chain of pulses instead of one (which may result in a SET pattern instead of a SET pulse).

By specifically shaping a radiation pulse, particularly an electromagnetic radiation pulse, it may be possible for the system to distinguish between nevertheless present background radiation (such as cosmic radiation or daylight) on the one hand and radiation generated specifically for manipulating the phase change material on the other hand. In other words, a radiation pattern may serve as some kind of fingerprint for a radiation pulse that is generated with the intention to trigger a phase change.

The heat transfer structure may be configured for being heated by the impinging electromagnetic radiation in a manner of the group consisting of inductively heating the heat transfer structure, and heating by alternatively magnetizing and demagnetizing the heat transfer structure. For such an inductive heating procedure, Faraday's induction law may be used, that is to say the generation of eddy currents in a conductive material irradiated by a high-frequency electromagnetic field may be used. Damping of the eddy currents by ohmic losses may then serve as a heating mechanism. Alternatively, (an alternating sequence of) magnetizing and demagnetizing the heat transfer structure by a time-dependent magnetic field may be implemented when the heat transfer structure has magnetic properties, particularly has paramagnetic, ferromagnetic, ferrimagnetic or antiferromagnetic properties. In this scenario, magnetic moments may be reoriented under the influence of a time-dependent magnetic field, which may also produce friction losses in the material that are converted into heat to warm up the phase change structure.

The heat transfer structure may be an electrode. An electrode may be an electrically conductive member that can be specifically designed to be prone to the absorption of specific electromagnetic radiation. This may include designing the electrode in a manner that quasi particles or resonances may be excited in the electrode by irradiation. Also, additives may be included in the electrode to enhance the interaction with the radiation, particularly electromagnetic radiation.

The heat transfer structure may be formed by a single or multiple structure, for instance, a possible embodiment of the invention may be one or several rings surrounding the convertible structure (see FIG. 14). The heat transfer structure may have any relative position or distance with respect to the convertible structure. The materials used for the heat transfer structure may be any material that is heated by the incidence of an electromagnetic radiation. An embodiment may particularly use a heater made on any kind of magnetic material. An embodiment of the invention may use particularly a ferromagnetic material as a heater, wherein appropriate ferromagnetic materials are iron, nickel, cobalt and manganese, or their compounds, also many types of steel show very good ferromagnetic properties.

The electronic device may comprise a switch, particularly a field effect transistor or a diode, electrically coupled to the phase change structure. In such a configuration, the field effect transistor may serve as a switch to allow an access to the phase change structure, or to prevent such an access. However, in contrast to conventional systems, the phase change structures does not have to be programmed purely electronically, that is to say by applying an electrical programming signal to the field effect transistor and consequently to the phase change structure. In contrast to this, the field effect transistor may be controlled with very small signals, and the phase change structure may be switched between different phase modes by electromagnetic radiation. This may allow using very low-cost field effect transistors, which do not necessarily have to have the capability to bear high voltages which are necessary for switching the phase change structure.

The electronic device may comprise an additional heating mechanism for selectively heating the phase change structure, particularly an additional heating by applying an electric heating signal to the phase change structure. For instance, when a memory shall be programmed, a SET pulse and a RESET pulse may both be generated electromagnetically. Alternatively, it is also possible to provide the crystallization pulse and/or a part of the RESET pulse electrically (thus wired), and to add a further component that is particularly necessary for the RESET pulse electromagnetically (thus wireless). Thus, low cost transistors may be implemented, since only low-energy electric signals have to be applied.

The electronic device may be adapted as a memory device. In such a memory device, the information of one or more bits may be stored in the present phase of the phase change structure, particularly depending on the present one of two or more phase states of the phase change structure.

The electronic device may also be adapted as a memory array, that is a configuration of a (large) plurality of memory devices of the aforementioned type. In such a memory array, the memory cells may be arranged in a matrix-like manner and may be controlled via bit lines and word lines with transistors serving as switches to get access to desired individual memory cells or memory devices. Particularly, by putting such a memory array in an oven (a conventional oven or a dedicated chamber in which electromagnetic radiation can be applied), mass erasure of the information stored in all of the memory devices may be made possible. The multiple memory cells may be integrated in a common substrate.

The electronic device may also be adapted as a gain controller. By emitting an electromagnetic gain control signal which interacts with the heat transfer structure, a phase change of the phase change structure (or an NTC) may be triggered intentionally which may have a direct influence on a gain supplied to a load (the load can also be a phase change material, whereas the control structure can be a material whose properties change with heat), since the electrical conductivity of the phase change structure connected in a line with the load can be adjusted. In this context, not only a phase change can be triggered but also the properties of any other element that varies its properties with temperature.

The electronic device may also be adapted as an electromagnetic radiation sensor. When electromagnetic radiation to be detected is present, it will interact with a heat transfer structure and will result in a change of the phase of the phase change structure. Therefore, the electrical conductivity of the phase change structure will be modified in accordance with the electromagnetic radiation to be detected, and this change will be sampled electronically.

The electronic device may also serve as an actuator, since a change of the electrical conductivity of the phase change structure may result in the modification of an actuation signal.

It is also possible to adapt the electronic device as a microelectromechanical structure (MEMS). An electronic signal modified by a phase change of the phase change structure initiated by an impinging electromagnetic control signal may result in a specific movement of a movable component of the microelectromechanical structure (MEMS).

It is clear that the modification of the phase change material, and therefore of its electrical conductivity, may be used to construct controllers, switches, transductors, etc.

The radiation, particularly an electromagnetic radiation pulse may be used for programming (storing) information in and/or erasing information from the electronic component in a configuration as a memory cell.

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, vapour etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The structure may be formed on a purely crystalline silicon wafer or on an SOI wafer (Silicon On Insulator).

Any process technologies like CMOS, BIPOLAR or BICMOS technology may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
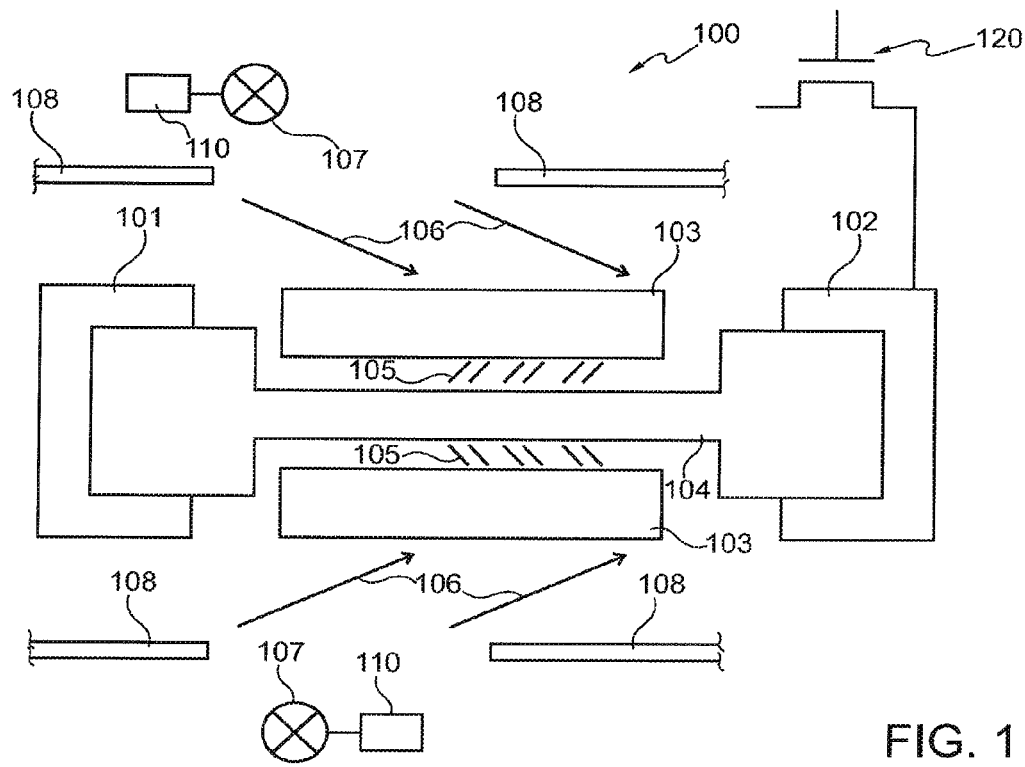
FIG. 1 illustrates an electronic memory cell device according to an exemplary embodiment of the invention.
Figure 2:
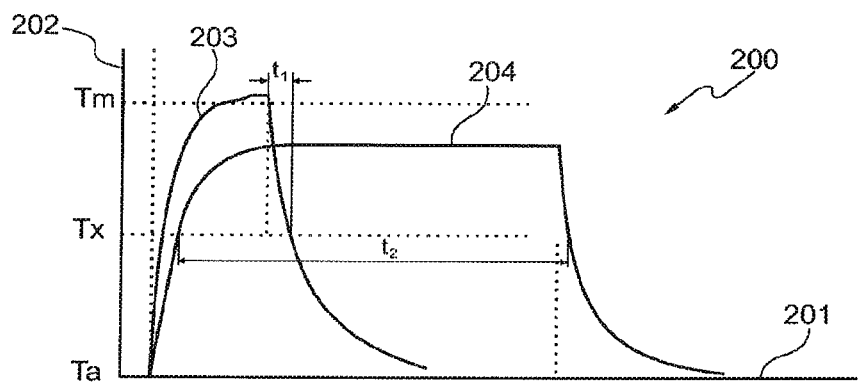
FIG. 2 illustrates SET and RESET temperature profiles of a conventional memory cell.
Figure 3:
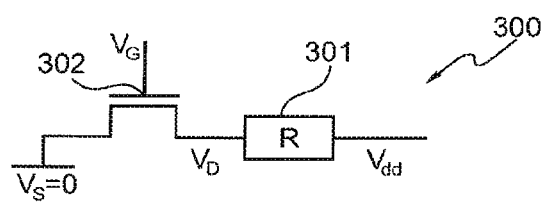
FIG. 3 illustrates a conventional phase change memory cell.
Figure 4:
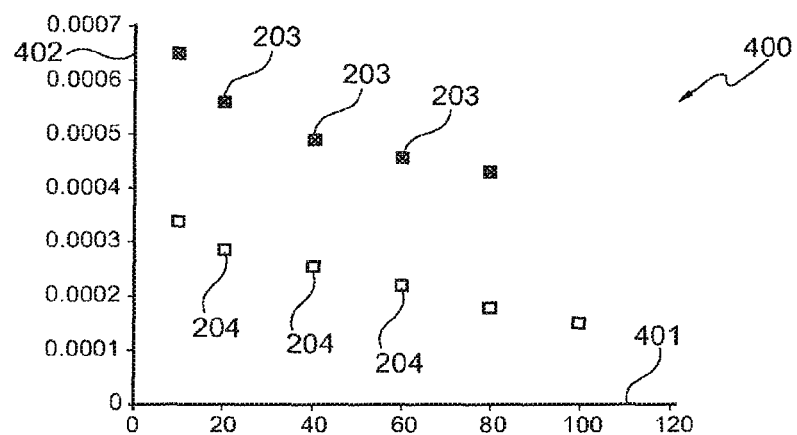
FIG. 4 illustrates a minimum amorphisation power/crystallisation power in a conventional phase change cell.
Figure 5:
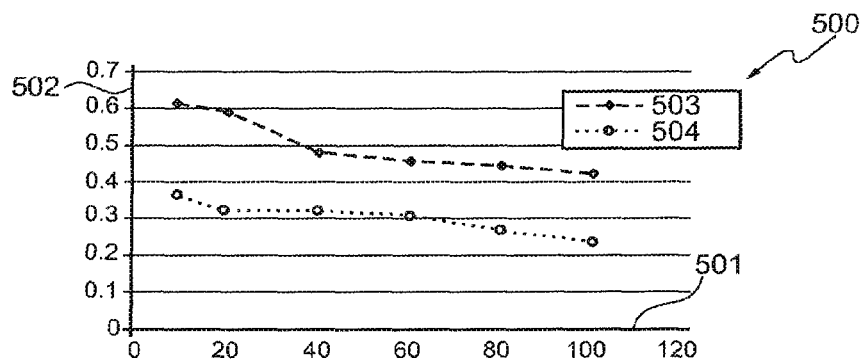
FIG. 5 illustrates SET and RESET currents applied in a conventional memory cell.
Figure 6:
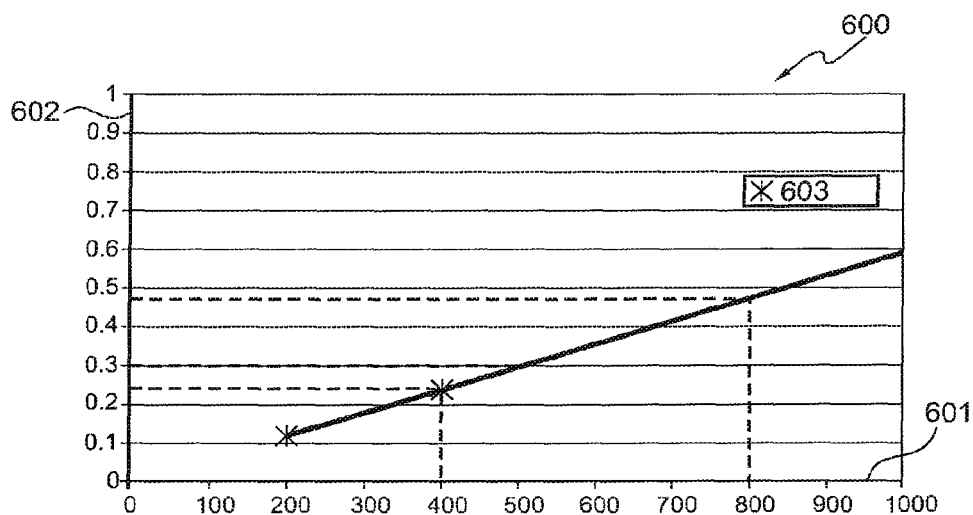
FIG. 6 illustrates transistor currents used in the design of a conventional phase change memory array.

The illustration in the drawing is schematical. In different drawings, similar or identical elements are provided with the same reference signs.

In the following, referring to FIG. 1, a memory cell 100 as an example for an electronic device according to an exemplary embodiment of the invention will be explained.

The memory cell 100 comprises a first electrical contact 101 (which may be brought to a reference potential) and a second electrical contact 102. An electrode 103 is provided as a heat transfer structure. A phase change structure 104 made of a chalcogenide material is connected between the first electrical contact 101 and the second electrical contact 102. The chalcogenide 104 is convertible between a crystalline phase and an amorphous phase by heating. In these two states, the electrical conductivity of the phase change structure 104 is different.

The second electrical contact 102 is coupled to a drain of a switch transistor 120. By applying an appropriate voltage to a gate of the switch transistor 120, in information stored in the phase change structure 104 can be sampled/programmed, since a value of a current flowing between the source and the drain of the switch transistor 120 depends on the electrical conductivity and therefore on the present phase of the phase change structure 104.

As can be taken from FIG. 1, the heat transfer structure 103 is arranged to be heated by electromagnetic radiation 106 impinging on the electrode 103. The phase change structure 104 is thermally coupled to the heat transfer structure 103 so that the phase change structure 104 is convertible between the crystalline phase and the amorphous phase when the radiation 106 impinges on the heat transfer structure 103. The selected phase mode of the phase change structure 104 can be adjusted by applying a corresponding radiation 106 pattern to the heat transfer structure 103 producing heat 105 for heating the thermally coupled phase change structure 104.

The electromagnetic radiation 106 emitted by an electromagnetic radiation source 107 such as a Laser or a photodiode is infrared radiation in the present embodiment. Alternatively, the cell 100 may simply be placed in an oven in which electromagnetic radiation is generated, thus eliminating the need of an optical light source 107. An aperture 108 is provided and arranged in such a manner that the radiation 106 only impinges on the heat transfer structure 103, thereby indirectly heating the chalcogenide structure 104.

Electromagnetic radiation used for applications according to other exemplary embodiments of the invention may be in the order of MHz. No light and no aperture are necessary in such an embodiment. Induction furnaces may be used for similar applications (heating metals).

Since the electrical conductivity of the chalcogenide structure 104 is different in the amorphous phase than in the crystalline phase, a current flowing between the components 101 and 102 as a result of a constant voltage applied between the structures 101 and 102 depends on the present phase so that the cell 100 may be used as a memory. For instance, a larger electrical conductivity of the chalcogenide 104 can be interpreted as a logical value "1", and a lower electrical conductivity of the chalcogenide 104 can be interpreted as a logical value "0".

As will be described below in more detail, the pulse pattern of the electromagnetic radiation 106 generated by the electromagnetic radiation source 107 under control of a control unit 110 allows to accurately design whether the chalcogenide structure 104 is converted from a crystalline phase to an amorphous phase, or vice versa (see FIG. 11).

Figure 7:
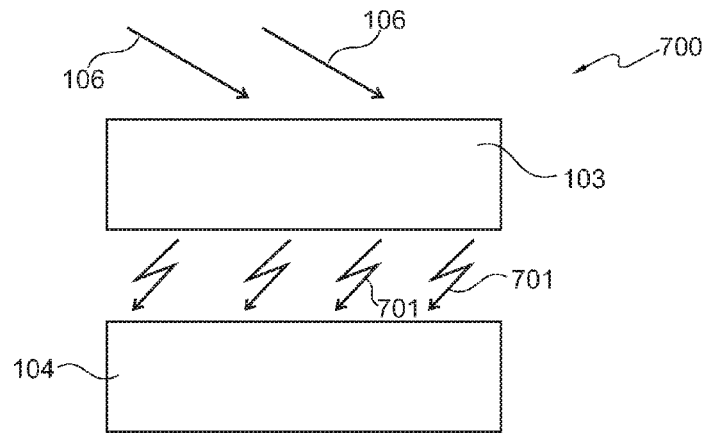
FIG. 7 illustrates an electronic device according to an exemplary embodiment of the invention.

FIG. 7 illustrates an electronic device 700 as an example for a general description of how embodiments of the invention may be built.

The starting point is a material 104 with temperature-dependent properties such as a phase change material or variable element. Next to this material, embedded within it or even separated from it, a heater 103 may be placed. The heater 103 may be made of a material able to heat up with an external incoming radiation 106. A heat flow 701 from the heater 103 will reach directly or indirectly the temperature-dependent material 104. If this heat 701 is sufficient or if this heat is reinforced with another additional heat source (such as a Joule heating element, a Laser, etc.), the temperature-dependent material 104 will change its properties.

Figure 8:
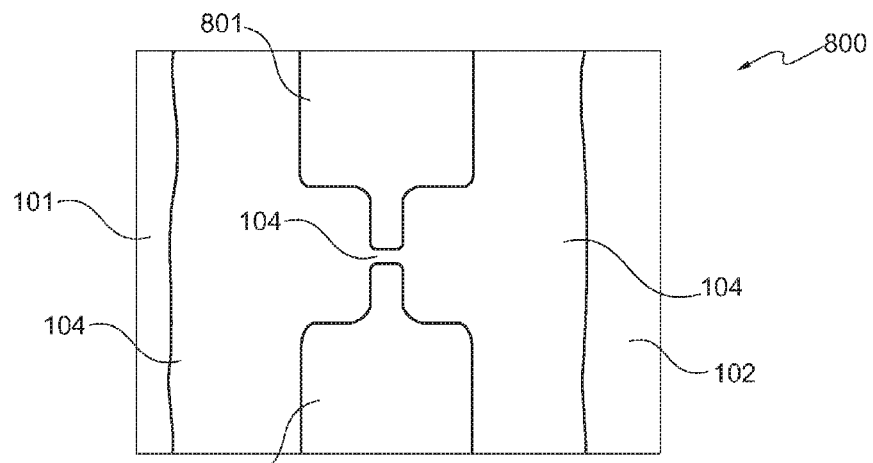
FIG. 8 illustrates an image of an integrated memory cell.

FIG. 8 shows an image of a monolithically integrated semiconductor structure 800 of a phase change memory cell. The components 101, 102 and 104 are shown together with an electrically insulating structure 801.

Figure 9:
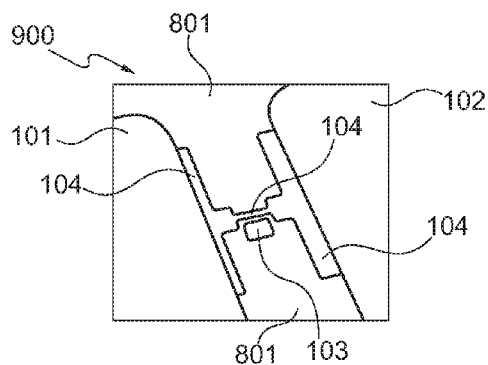
FIG. 9 illustrates an image of a modified integrated memory cell according to an exemplary embodiment of the invention.

FIG. 9 shows a memory cell 900 according to an exemplary embodiment of the invention that is based on the structure 800 shown in FIG. 8.

Additionally, the heater 103 is provided in parallel to the phase change material 104.

Figure 10:
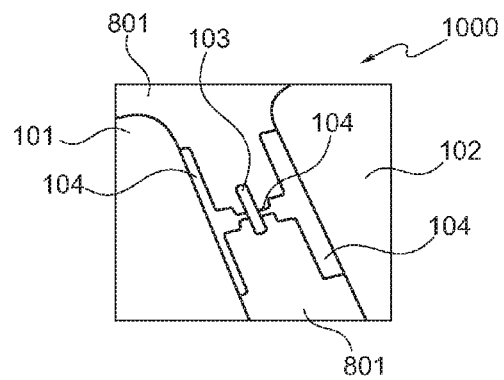
FIG. 10 illustrates an image of a modified memory cell according to an exemplary embodiment of the invention.

In the embodiment 1000 shown in FIG. 10, the heater 103 is placed perpendicular to an extension of the phase change material 104.

Figure 11:
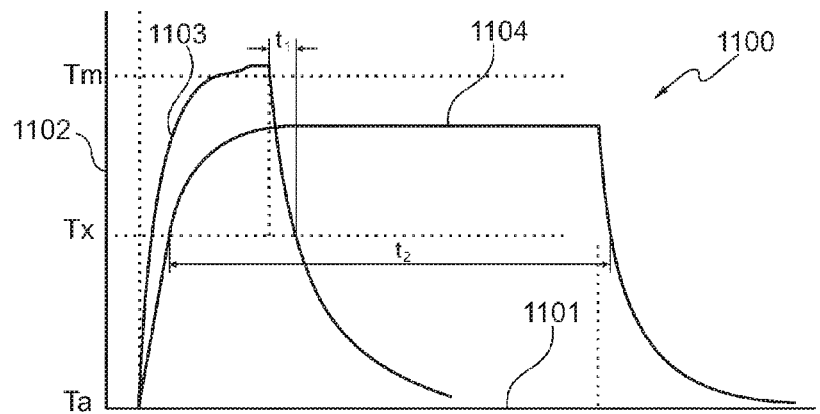
FIG. 11 illustrates a programming temperature profile for a phase change element according to an exemplary embodiment of the invention.

FIG. 11 shows a diagram 1100 illustrating a programming temperature profile for a phase change element 104 according to an exemplary embodiment of the invention such as the one shown in FIG. 1 or FIG. 7.

Along an abscissa 1101 of the diagram 1100, the time is plotted. Along an ordinate 1102, the temperature is plotted. FIG. 11 illustrates an amorphizing RESET pulse 1103 that brings the chalcogenide 104 from a crystalline phase into an amorphous phase. Furthermore, a crystallizing SET pulse 1104 is illustrated in FIG. 11 that can be applied to bring the chalcogenide 104 from an amorphous phase into a crystal phase. The pulses shown in FIG. 11 are only exemplary and may have different shape.

In the case of a phase change memory 100, an electromagnetic radiation beam 106 can be applied to the heater 103 in order to indirectly program the phase change material 104. The electromagnetic radiation 106 shall have the shape of a short pulse to create a suitable temperature profile that can program the adjacent phase change material 104. The required temperature profiles are indicated in FIG. 11.

As can be taken there, in the present embodiment both the amorphizing RESET pulse 1103 and the crystallizing SET pulse 1104 have a concave raising edge and a convex falling edge. As can be taken from FIG. 11, the amorphizing RESET electromagnetic radiation pulse 1103 involves higher temperatures than the crystallizing electromagnetic SET pulse 1104, but may have a smaller time duration.

There are many ways of building the heater element 103. It can be deposited and patterned, created by a self-aligned process, with a Damascene technique, by growing, etc.

The operation principle of the heater 103 may be based on the generation of eddy currents together with magnetizing heating. Examples for such heating procedures are disclosed, as such, in U.S. Pat. No. 6,884,328 B2 which is herein incorporated by reference regarding these heating procedures.

In the following, referring to FIG. 12, an automatic gain controller 1200 according to an exemplary embodiment of the invention will be explained.

Figure 12:
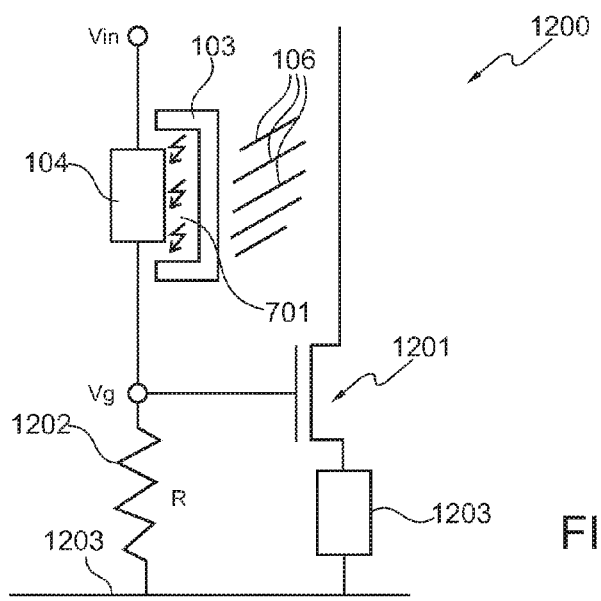
FIG. 12 illustrates an automatic gain controller according to an exemplary embodiment of the invention.

The level of incoming radiation 106 controls the automatic gain controller 1200 shown in FIG. 12. A voltage $V_{in}$ is applied to a first connection of a thermo-resistance 104. When radiation 106 irradiates the heater electrode 103, heat 701 is generated which changes the resistivity value of the thermal resistance 104. This modifies a voltage $V_g$ applied to a gate of a field effect transistor 1201. An auxiliary resistor 1202 is shown which is connected between $V_g$ and a reference voltage 1203. Furthermore, the gate voltage $V_g$ controls the conductivity of the MOSFET 1201 so that the gain applied to a load 1203 connected between one of the source/drain regions of the MOSFET 1201 and the reference potential 1203 can be adjusted by the incoming radiation 106.

An advantage of the system described herein is the possibility to use it as in an integrated circuit. Here, it is possible to have measurements of electromagnetic radiation and act consequently. Everything or a part of the components may be integrated in a small integrated circuit (IC).

One possible application is the protection against noise or electromagnetic compatibility. It can serve as a switch to turn on or off a system, or to tune the gain, in the presence of electromagnetic fields and according to the strength of them.

In the following, referring to FIG. 13, a memory cell 1300 as an example for an electronic device according to an exemplary embodiment of the invention will be explained.

Figure 13:
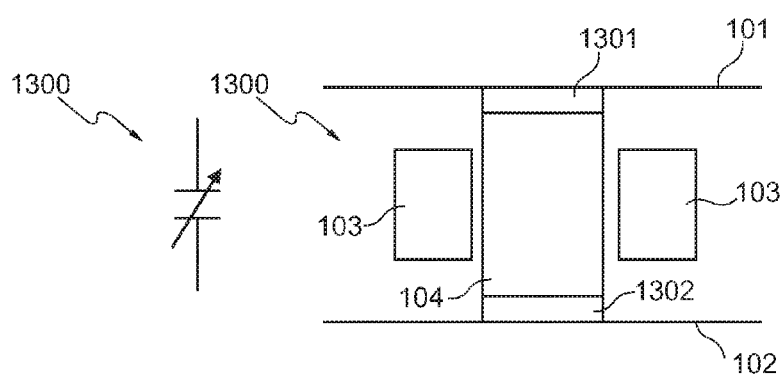
FIG. 13 illustrates an electronic memory cell device according to an exemplary embodiment of the invention.

In the embodiment of FIG. 13, the phase change material 104 serves, in connection with a first dielectric structure 1301 sandwiched between the first electrode 101 and the phase change material 104 and in connection with a second dielectric structure 1302 sandwiched between the first electrode 102 and the phase change material 104, as a controllable capacitance. When the heat transfer structure 103 is heated by impinging radiation, the structure of the phase change material 104 is altered and the capacitance of the arrangement 1300 is modified.

The embodiment of FIG. 13 may allow to selectively change the capacitance of the cell 1300, instead of only modifying the conductivity. Of course, also the conductivity of the phase change structure may change, as well, but particularly the change of the capacitance of the cell 1300 may be sampled or sensed.

Figure 14:
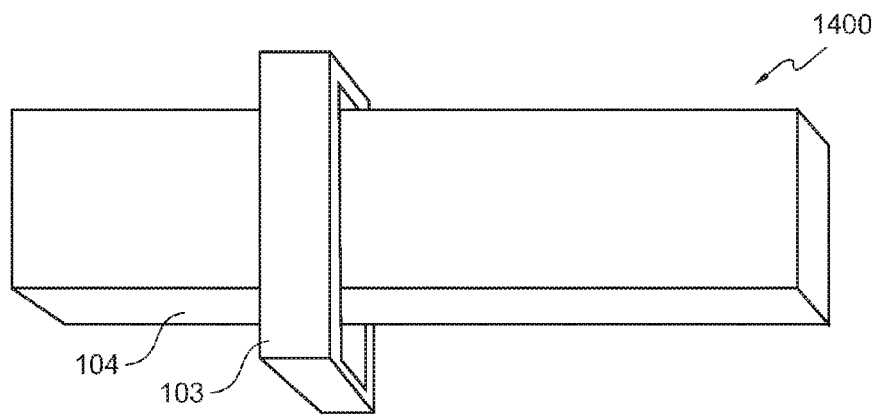
FIG. 14 illustrates an arrangement of a heater and a convertible material of an electronic device according to an exemplary embodiment of the invention.

FIG. 14 illustrates an arrangement 1400 of an annular heater 103 and a convertible material 104 according to an exemplary embodiment of the invention.

In the following, referring to FIG. 15 to FIG. 27, a method of manufacturing an electronic device according to an exemplary embodiment of the invention will be explained.

Figure 15:
FIG. 15 to FIG. 27 show layer sequences obtained when carrying out a method of manufacturing an electronic device according to an exemplary embodiment of the invention.

FIG. 15 shows a dielectric substrate 1500 as a starting point.

Figure 16:
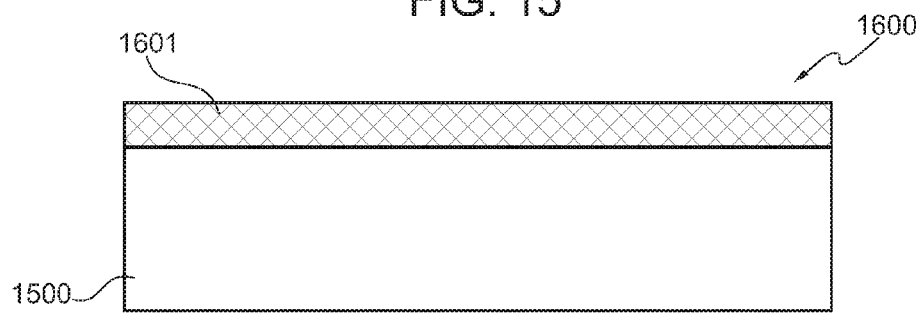

In order to obtain the layer sequence 1600 shown in FIG. 16, a ferromagnetic layer 1601 is deposited on the dielectric substrate 1500.

Figure 17:
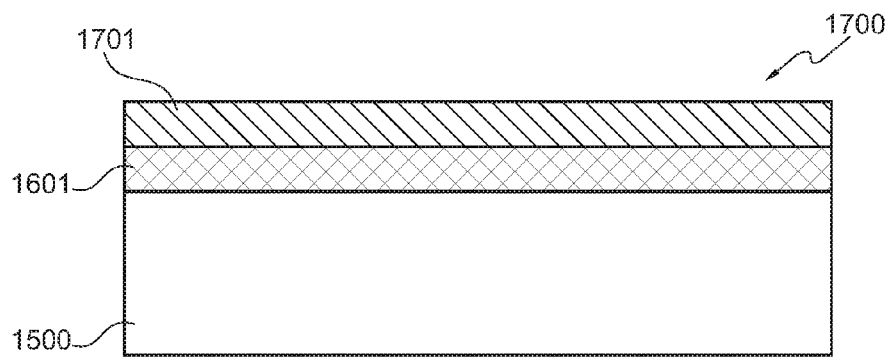

In order to obtain the layer sequence 1700 shown in FIG. 17, a photoresist layer 1701 is deposited on the ferromagnetic layer 1601. The photoresist layer 1701 is subsequently exposed to a radiation beam.

Figure 18:
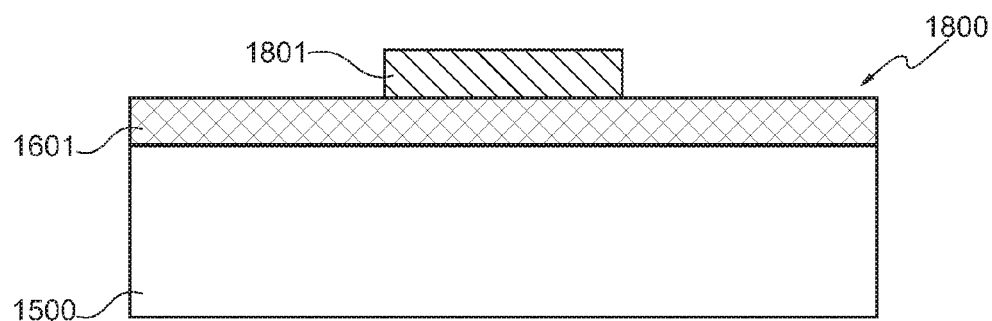

In order to obtain the layer sequence 1800 shown in FIG. 18, the photoresist layer 1701 is patterned to generate a structure 1801.

Figure 19:
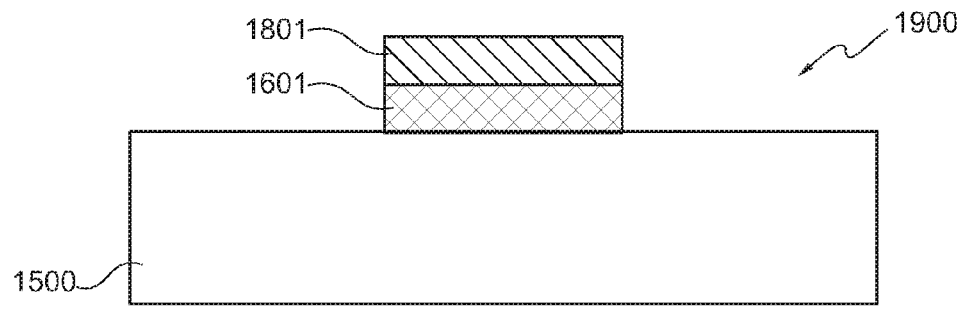

In order to obtain the layer sequence 1900 shown in FIG. 19, the structure 1801 is used as a mask for patterning the ferromagnetic layer 1601.

Figure 20:
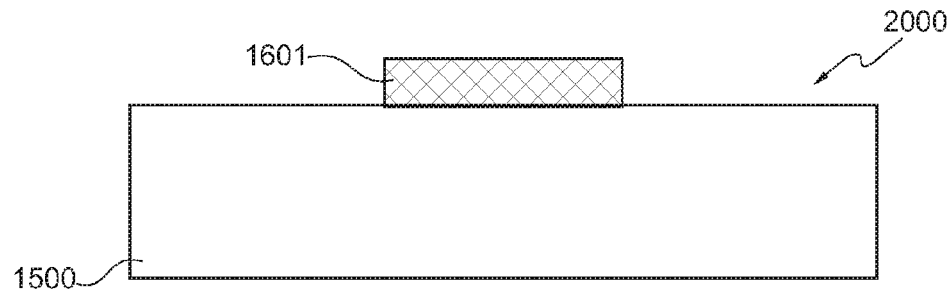

In order to obtain the layer sequence 2000 shown in FIG. 20, the structure 1801 is removed.

Figure 21:
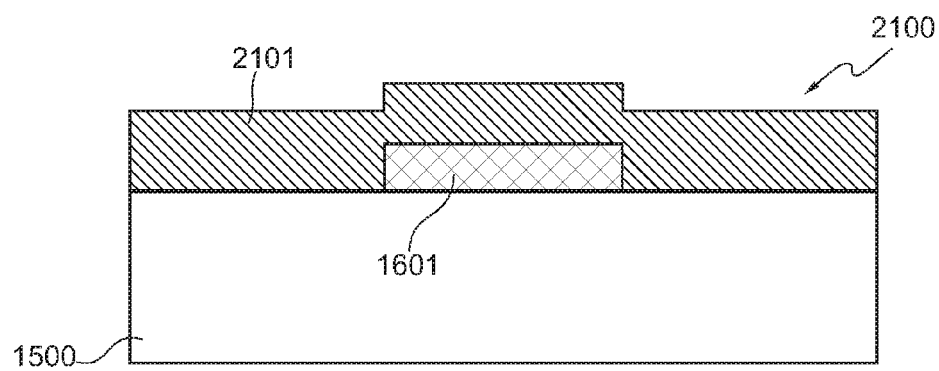

In order to obtain the layer sequence 2100 shown in FIG. 21, a dielectric layer 2101 is deposited on the layer sequence 2000.

Figure 22:
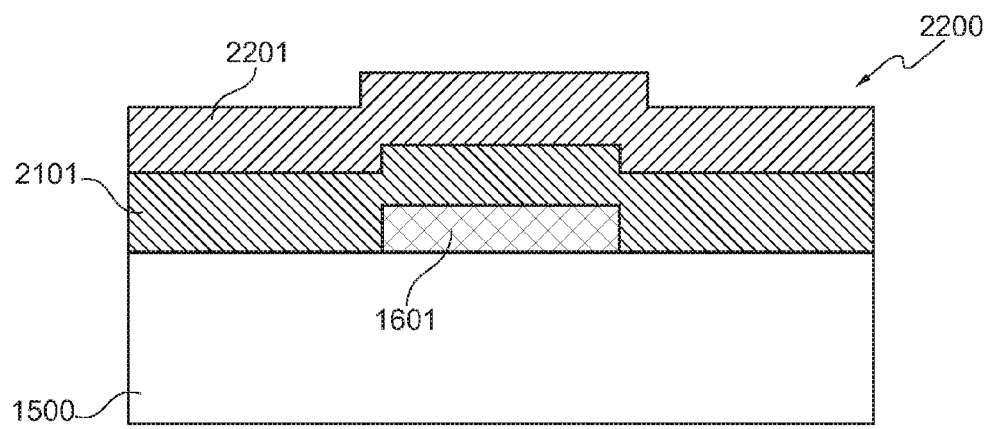

In order to obtain the layer sequence 2200 shown in FIG. 22, a phase change material 2201 is deposited on the layer sequence 2100.

Figure 23:
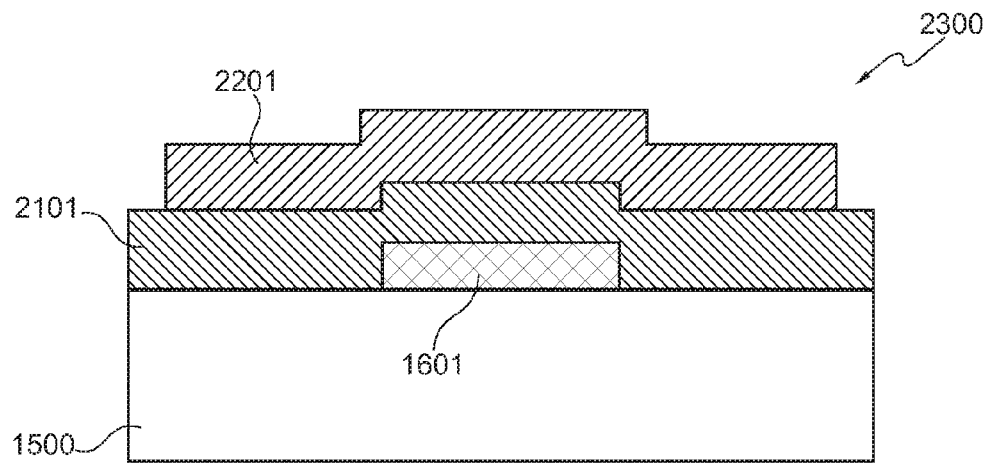

In order to obtain the layer sequence 2300 shown in FIG. 23, the phase change material 2201 is patterned.

Figure 24:
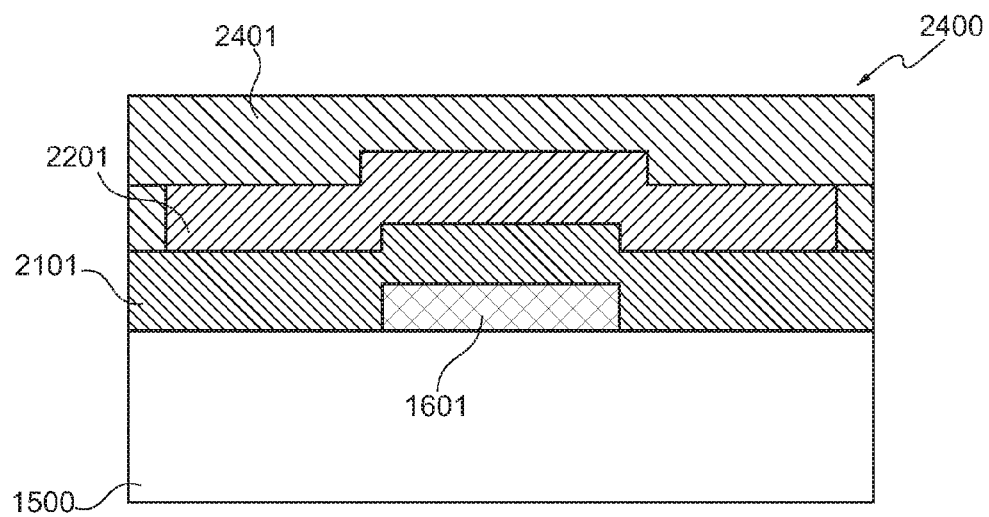

In order to obtain the layer sequence 2400 shown in FIG. 24, a further dielectric layer 2401 is deposited on the layer sequence 2300 and is exposed.

Figure 25:
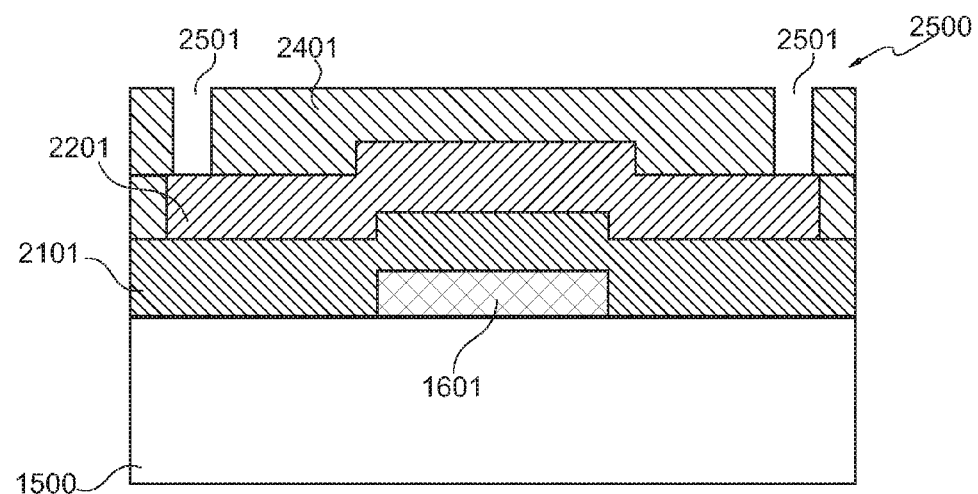

In order to obtain the layer sequence 2500 shown in FIG. 25, the further dielectric layer 2401 is patterned, for instance by etching, to generate trenches 2501.

Figure 26:
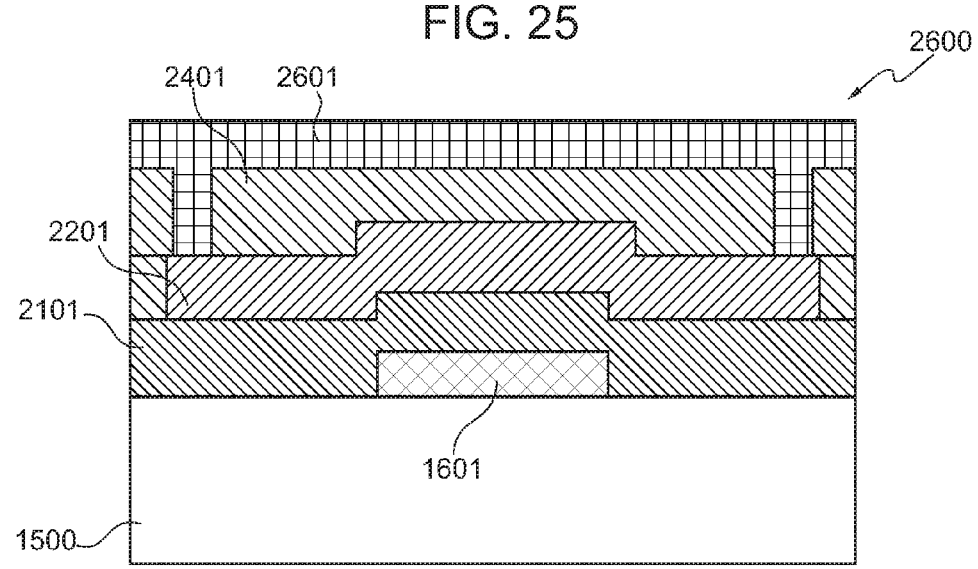

In order to obtain the layer sequence 2600 shown in FIG. 26, an electrically conductive electrode structure 2601 is formed by depositing material on the layer sequence 2500.

Figure 27:
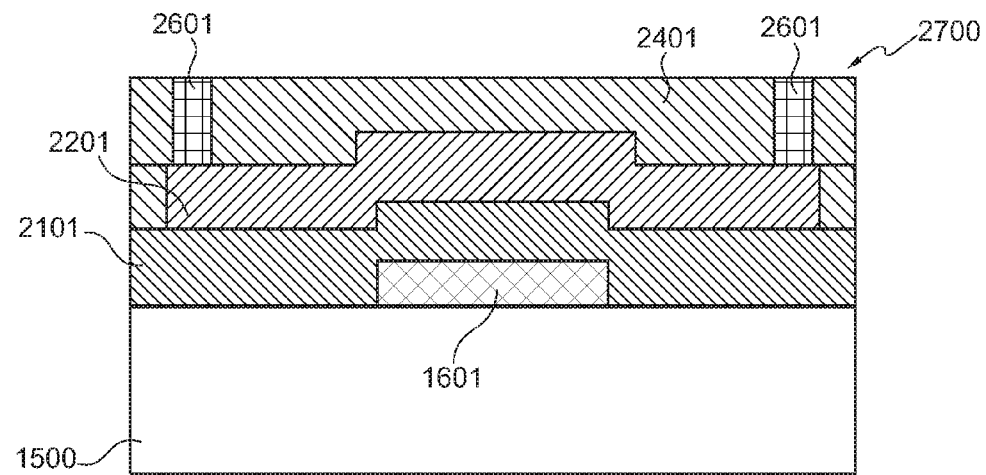

In order to obtain the layer sequence 2700 shown in FIG. 27, the electrode structure 2601 is patterned.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. An electronic device, the electronic device comprising
   a heat transfer structure configured and arranged for generating heat in response to electromagnetic radiation impinging on the heat transfer structure;
   a convertible structure thermally coupled to the heat transfer structure and configured and arranged to convert between at least two states of the electronic device in response to the electromagnetic radiation impinging on the heat transfer structure, wherein the convertible structure has different electrical properties in different ones of the at least two states, and wherein the heat transfer structure and the convertible structure are physically separated to provide a medium through which the heat indirectly passes to the convertible structure.

2. The electronic device according to claim 1, wherein the convertible structure is a thermo-dependent structure, particularly a phase change structure that is convertible between at least two phase-states, and further including an electromagnetic source configured and arranged with a variable frequency, bandwidth intensity, polarization coherence and amplitude and to provide the electromagnetic radiation indirectly to the heat transfer structure whereby the structures are arranged to pass heat from the heat transfer structure while separated from the convertible structure by a gap.

3. The electronic device according to claim 1, further including a control unit to design a pulse pattern of an electromagnetic source to convert the convertible structure between the at least two states and wherein the heat transfer structure is separated from the convertible structure by a gap.

4. The electronic device according to claim 1, wherein the different electrical properties are at least one of the group consisting of different values of the electrical conductivity, different values of the permittivity, different values of the magnetic permeability, different values of the capacitance, and different values of the inductance of the convertible structure.

5. The electronic device according to claim 1, comprising an electric sensing circuitry adapted for sensing the different electrical properties of the convertible structure in different ones of the at least two states.

6. The electronic device according to claim 1, wherein the heat transfer structure is arranged to be heated by electromagnetic radiation impinging on the heat transfer structure.

7. The electronic device according to claim 1, wherein the convertible structure is adapted such that a value of the electrical conductivity differs between the at least two states.

8. The electronic device according to claim 1, wherein the convertible structure is adapted such that one of the at least two states relates to a crystalline phase and another one of the at least two states relates to an amorphous phase of the convertible structure.

9. The electronic device according to claim 1, comprising a radiation source, particularly an electromagnetic radiation source, adapted for generating the radiation, particularly adapted for generating the electromagnetic radiation, for impinging on the heat transfer structure.

10. The electronic device according to claim 1, wherein the radiation source is adapted for generating the radiation in accordance with at least one predetermined radiation pulse pattern.

11. The electronic device according to claim 10, wherein the at least one predetermined radiation pulse pattern comprises a first radiation pulse pattern adapted for converting the convertible structure from a first one of the at least two states into a second one of the at least two states, and comprises a second radiation pulse pattern adapted for converting the convertible structure from the second one of the at least two states into the first one of the at least two states.

12. The electronic device according to claim 11,
    wherein the first radiation pulse pattern is adapted for heating the convertible structure up to a first temperature value;
    wherein the second radiation pulse pattern is adapted for heating the convertible structure up to a second temperature value;
    wherein the first temperature value is smaller than the second temperature value.

13. The electronic device according to claim 1, wherein the heat transfer structure is configured for being heated by the impinging electromagnetic radiation in a manner of the group consisting of inductively heating the heat transfer structure, and heating the heat transfer structure by alternatively magnetizing and demagnetizing the heat transfer structure.

14. The electronic device according to claim 1, wherein the heat transfer structure is an electrode.

15. The electronic device according to claim 1, comprising a switch, particularly a field effect transistor, electrically coupled to the convertible structure.

16. The electronic device according to claim 1, comprising a supplementary heating mechanism for selectively heating the convertible structure, particularly a supplementary heating mechanism heating by applying an electric heating signal to the convertible structure.

17. The electronic device according to claim 1, adapted as one of the group consisting of a memory device, a memory array, a gain controller, an electromagnetic radiation sensor, a radiation sensor, an actuator, a microelectromechanical structure, a controller, a switch, and a transductor.

18. A method of operating an electronic device, the method comprising
impinging radiation on a heat transfer structure of the electronic device which generates heat in response to electromagnetic impinging radiation;
heating a convertible structure of the electronic device, the convertible structure is thermally coupled to the heat transfer structure and separated therefrom by a gap, under the influence of the heat generated by the radiation impinging on the heat transfer structure to convert the convertible structure between two of at least two states of the electronic device, wherein the convertible structure has different electric properties in different ones of the at least two phase states.

19. The method according to claim 18, wherein the converting includes at least one of the group consisting of programming information in and erasing information from the electronic device configured as a memory cell.

20. The method according to claim 18, wherein the impinging radiation on a heat transfer structure includes one of the group consisting of inductively heating the heat transfer structure, and heating the heat transfer structure by alternatively magnetizing and demagnetizing the heat transfer structure.

\* \* \* \* \*